(12) United States Patent
Tanaka (10) Patent No.: US 9,312,870 B2
(45) Date of Patent: Apr. 12, 2016

(54) QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventor: Noriaki Tanaka, Chino (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 14/568,567

(22) Filed: Dec. 12, 2014

(65) Prior Publication Data

US 2015/0171876 A1     Jun. 18, 2015

(30) Foreign Application Priority Data

Dec. 13, 2013  (JP) ................................ 2013-258548

(51) Int. Cl.
  *H03L 7/26*     (2006.01)
  *H05B 1/02*     (2006.01)

(52) U.S. Cl.
  CPC ... *H03L 7/26* (2013.01); *H05B 1/02* (2013.01)

(58) Field of Classification Search
  CPC .......................................................... H03L 7/26
  USPC ................................................... 331/94.1, 3
  See application file for complete search history.

(56) References Cited

U.S. PATENT DOCUMENTS

2009/0324449 A1* 12/2009 Kira ................................ 422/96
2013/0015920 A1*  1/2013 Sato et al. ..................... 331/94.1

FOREIGN PATENT DOCUMENTS

JP         2001-339302  A     12/2001

* cited by examiner

*Primary Examiner* — Joseph Chang
(74) *Attorney, Agent, or Firm* — Harness, Dickey & Pierce, P.L.C.

(57) ABSTRACT

An atomic oscillator includes a gas cell in which metal atoms are sealed, a heating unit that is driven by the supply of power and heats the gas cell, a power terminal, and a boosting circuit that boosts a voltage output from the power terminal and then is applied to the heating unit. The boosting circuit has a switching regulator function, and a switching frequency of the boosting circuit is equal to or higher than 10 kHz and equal to or lower than 10 MHz.

9 Claims, 8 Drawing Sheets

QUANTUM INTERFERENCE DEVICE, ATOMIC OSCILLATOR, ELECTRONIC APPARATUS, AND MOVING OBJECT

BACKGROUND

1. Technical Field

The present invention relates to a quantum interference device, an atomic oscillator, an electronic apparatus, and a moving object.

2. Related Art

As an oscillator having high-accuracy oscillation characteristics on a long-term basis, an atomic oscillator is known which oscillates on the basis of energy transfer of atoms of an alkali metal such as rubidium or cesium (for example, see JP-A-2001-339302).

In general, an operating principle of the atomic oscillator is classified broadly into a method using a double resonance phenomenon based on light and microwaves and a method using a quantum interference effect (CPT: coherent population trapping) based on two types of light beams having different wavelengths. However, the atomic oscillator using a quantum interference effect can be made smaller than the atomic oscillator using a double resonance phenomenon, and thus has been recently expected to be mounted to various devices.

For example, as disclosed in JP-A-2001-339302, the atomic oscillator using a quantum interference effect includes a gas cell in which gaseous metal atoms are sealed, a semiconductor laser that irradiates the metal atoms in the gas cell with a laser beam including two types of resonance light beams having different frequencies, and a photodetector that detects the laser beam having passed through the gas cell. In such an atomic oscillator, an electromagnetically induced transparency (EIT) phenomenon occurs in which both of the two types of resonance light beams pass without being absorbed into the metal atoms within the gas cell when a frequency difference between the two types of resonance light beams has a specific value. The photodetector detects an EIT signal which is a sharp signal generated in association with the EIT phenomenon.

In addition, the atomic oscillator includes a heater that heats the gas cell, and a coil that generates a magnetic field in a direction along the axis of the laser beam in the gas cell. The gas cell is heated by the heater so that the alkali metal within the gas cell is maintained in a gaseous state having a desired concentration. In addition, Zeeman splitting occurs due to the magnetic field, and thus it is possible to improve a resolution by widening a gap between different energy levels at which the atoms of the alkali metal within the gas cell degenerate. As a result, it is possible to increase the accuracy of an oscillation frequency of the atomic oscillator.

Incidentally, in order to reduce the power consumption of the atomic oscillator, a power supply voltage is required to be decreased. However, in the heater, a current is increased by a decrease in a voltage so that power supplied to the heater does not change. For this reason, a magnetic field generated due to electrical conduction to the heater is increased, and the magnetic field acts within the gas cell, and thus an adverse effect such as a decrease in the accuracy of the oscillation frequency of the atomic oscillator is exerted. Meanwhile, such a problem is the same as in the atomic oscillator using a double resonance phenomenon based on light and microwaves.

SUMMARY

An advantage of some aspects of the invention is to provide a quantum interference device and an atomic oscillator which are capable of reducing a magnetic field generated by electrical conduction to a heating unit and to provide an electronic apparatus and a moving object, having excellent reliability, which include the quantum interference device.

The invention can be implemented as the following forms or application examples.

APPLICATION EXAMPLE 1

This application example is directed to a quantum interference device including a gas cell in which metal atoms are sealed; a heating unit that heats the gas cell by receiving supply of power; a power terminal; and a boosting circuit that boosts a voltage output from the power terminal and applies the voltage to the heating unit.

With this configuration, first, it is possible to reduce power consumption by decreasing a power supply voltage. It is possible to reduce a current flowing through the heating unit while maintaining constant power supplied to the heating unit by boosting a voltage applied to the heating unit using the boosting circuit. Thus, it is possible to reduce a magnetic field generated in the heating unit by electrical conduction to the heating unit. Accordingly, it is possible to prevent or suppress the magnetic field generated in the heating unit from exerting an adverse effect within the gas cell, to stabilize a magnetic field generated in an internal space of the gas cell, and to improve the accuracy of an oscillation frequency of the atomic oscillator. In addition, it is possible to simplify a magnetic shield.

APPLICATION EXAMPLE 2

In the quantum interference device according to the application example, it is preferable that the boosting circuit has a switching regulator function.

With this configuration, it is possible to achieve high efficiency and cost reduction.

APPLICATION EXAMPLE 3

In the quantum interference device according to the application example, it is preferable that a switching frequency of the boosting circuit is in a range of equal to or higher than 10 kHz and equal to or lower than 10 MHz.

With this configuration, it is possible to prevent or reduce the influence on atomic resonance.

APPLICATION EXAMPLE 4

In the quantum interference device according to the application example, it is preferable that an amplification factor of a voltage of the boosting circuit is in a range of two times or more and five times or less.

With this configuration, it is possible to reduce a magnetic field generated by electrical conduction to the heating unit.

APPLICATION EXAMPLE 5

In the quantum interference device according to the application example, it is preferable that the quantum interference device further includes a light emission unit that emits light toward the gas cell; a light detection unit that detects intensity of the light passing through the gas cell; a light emission unit control unit that controls driving of the light emission unit; and a temperature control unit that controls driving of the heating unit, and the boosting circuit is not connected to the light emission unit, the light detection unit, the light emission unit control unit, and the temperature control unit.

With this configuration, parameters of the boosting circuit can be freely set so as to be optimized for the heating unit.

APPLICATION EXAMPLE 6

In the quantum interference device according to the application example, it is preferable that the heating unit includes a heater having a heating resistor and the quantum interference device further comprise a temperature control unit that controls driving of the heater.

With this configuration, it is possible to maintain an alkali metal within the gas cell in a gaseous state having a desired concentration.

APPLICATION EXAMPLE 7

It is preferable that the quantum interference device according to the application example further includes a container that accommodates the heater and has a magnetic shielding property.

With this configuration, it is possible to prevent or suppress a magnetic field generated by the heater from acting within the gas cell.

APPLICATION EXAMPLE 8

It is preferable that the quantum interference device according to the application example further includes a shielding portion having a magnetic shielding property.

With this configuration, it is possible to prevent or suppress an unnecessary magnetic field from acting within the gas cell.

APPLICATION EXAMPLE 9

This application example is directed to an atomic oscillator including the quantum interference device according to the application example.

With this configuration, it is possible to reduce a magnetic field generated by electrical conduction to the heating unit while reducing power consumption. Thus, it is possible to stabilize a magnetic field generated in an internal space of the gas cell, to improve the accuracy of an oscillation frequency of the atomic oscillator, and to simplify magnetic shielding.

APPLICATION EXAMPLE 10

This application example is directed to an electronic apparatus including the quantum interference device according to the application example.

With this configuration, it is possible to provide the electronic apparatus with low power consumption and excellent reliability.

APPLICATION EXAMPLE 11

This application example is directed to a moving object including the quantum interference device according to the application example.

With this configuration, it is possible to provide the moving object with low power consumption and excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a quantum interference device, an atomic oscillator, an electronic apparatus, and a moving object according to the invention will be described in detail with reference to an embodiment shown in the accompanying drawings.

1. Atomic Oscillator (Quantum Interference Device)

First, the atomic oscillator according to the invention (atomic oscillator including the quantum interference device according to the invention) will be described. Meanwhile, a description of an example in which the quantum interference device according to the invention is applied to the atomic oscillator will be made below. However, the quantum interference device according to the invention is not limited thereto, and can be applied to, for example, a magnetic sensor, a quantum memory, and the like in addition to the atomic oscillator.

Embodiments

Figure 1:
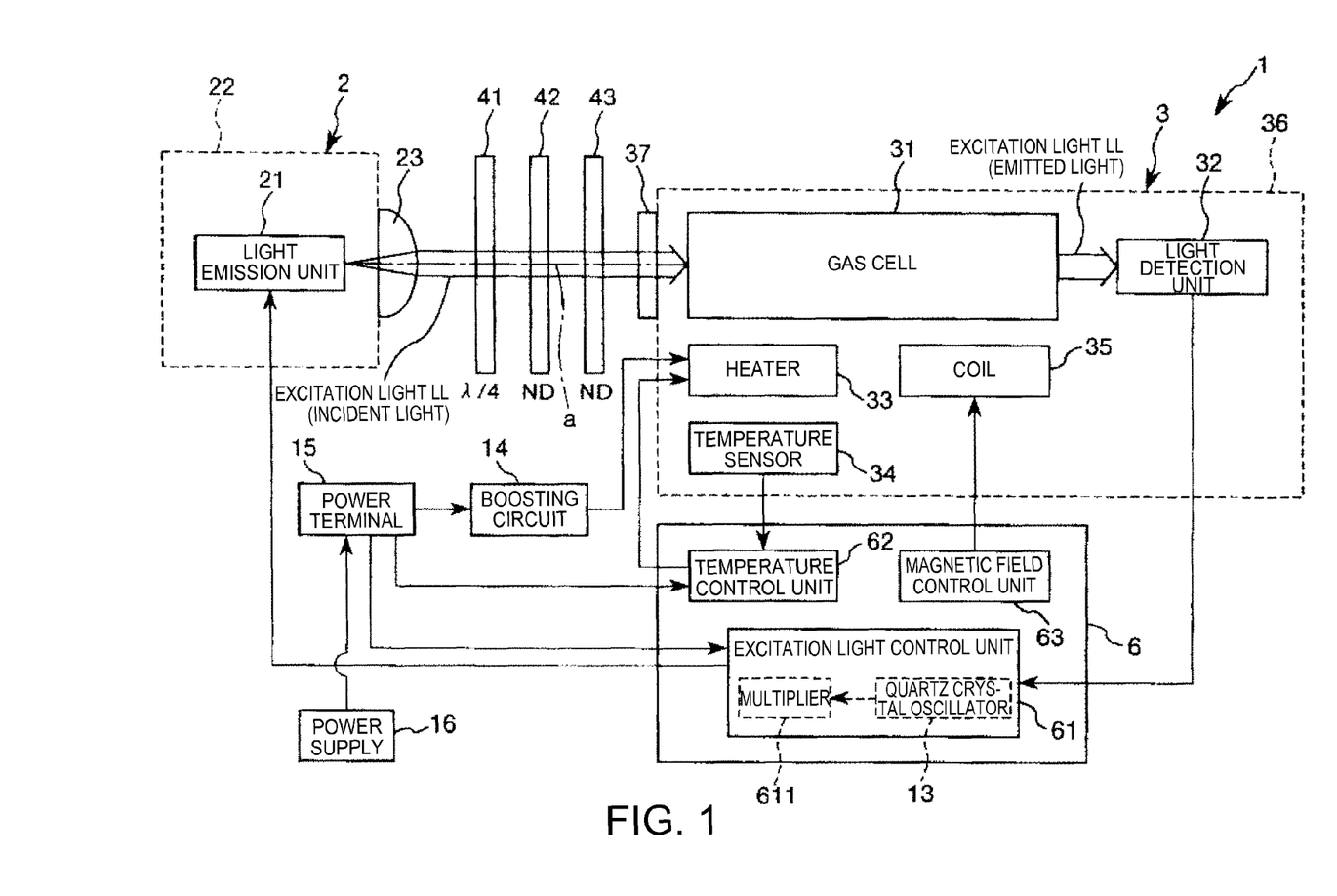
FIG. 1 is a diagram showing a schematic configuration of an atomic oscillator according to an embodiment of the invention.
Figure 2:
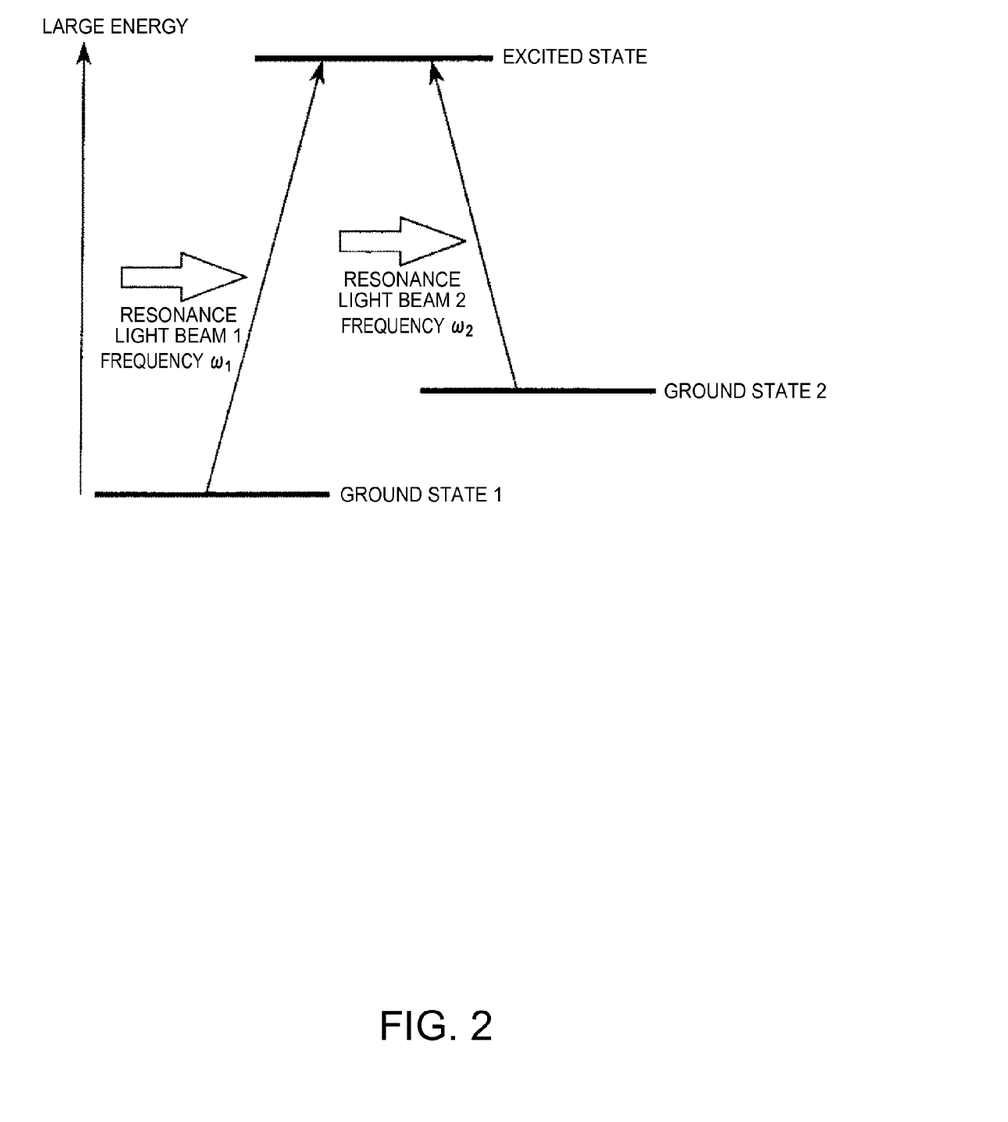
FIG. 2 is a diagram illustrating an energy state of an alkali metal.
Figure 3:
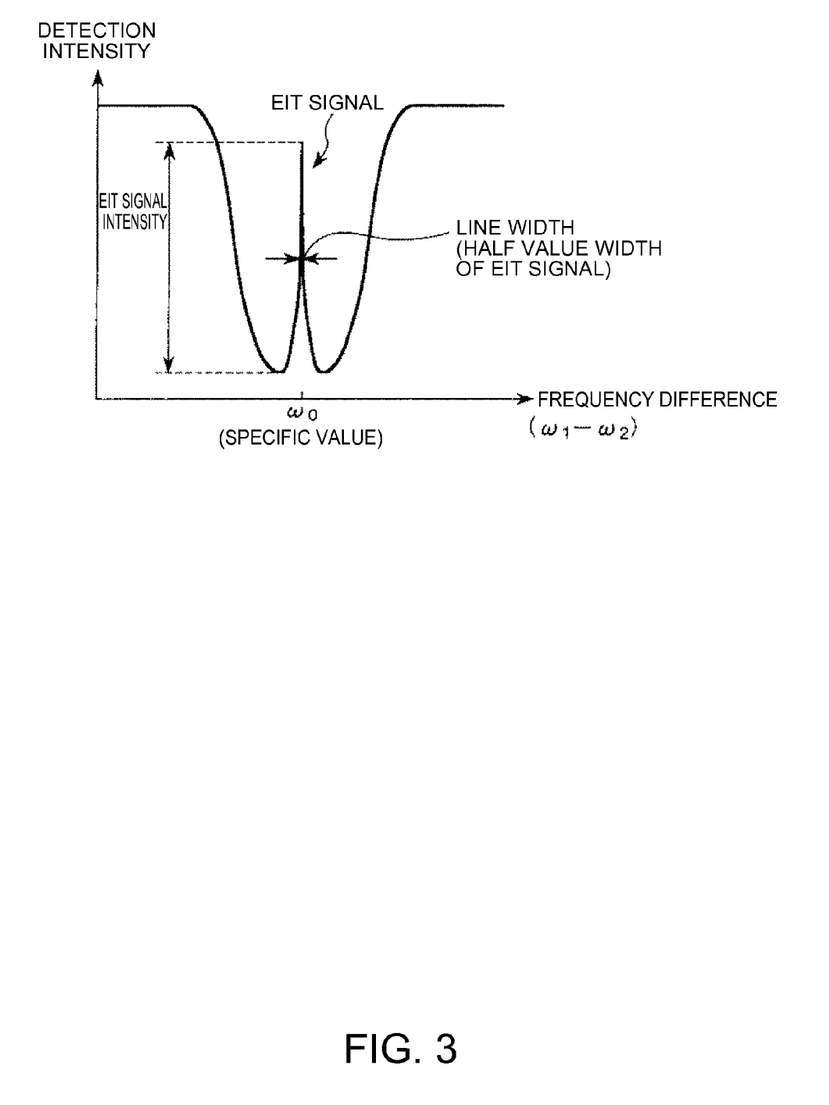
FIG. 3 is a graph showing a relationship between intensity of light detected by a light detection unit and a frequency difference between two light beams emitted from a light emission unit.

FIG. 1 is a diagram showing a schematic configuration of an atomic oscillator according to an embodiment of the invention. In addition, FIG. 2 is a diagram illustrating an energy state of an alkali metal, and FIG. 3 is a graph showing a relationship between intensity of light detected by a light detection unit and a frequency difference between two light beams emitted from the light emission unit.

An atomic oscillator 1 shown in FIG. 1 is an atomic oscillator using a quantum interference effect.

As shown in FIG. 1, the atomic oscillator 1 includes a first unit 2 which is a unit on a light emission side, a second unit 3 which is a unit on a light detection side, optical components 41, 42, and 43 provided between the units 2 and 3, and a control unit 6 that controls the first unit 2 and the second unit 3.

Here, the first unit 2 includes a light emission unit 21 and a first package 22 accommodating the light emission unit 21.

In addition, the second unit 3 includes a gas cell 31, a light detection unit 32, a heater (heating unit) 33, a temperature sensor 34, a coil 35, and a second package 36 that accommodates these components.

First, the principle of the atomic oscillator 1 will be briefly described.

As shown in FIG. 1, in the atomic oscillator 1, the light emission unit 21 emits an excitation light LL toward the gas cell 31, and the excitation light LL passing through the gas cell 31 is detected by the light detection unit 32.

A gaseous alkali metal (metal atom) is sealed in the gas cell 31. As shown in FIG. 2, the alkali metal has an energy level of a three-level system, and can take three states of two ground states (ground states 1 and 2) having different energy levels and an excited state. Here, the ground state 1 is an energy state which is lower than the ground state 2.

The excitation light LL emitted from the light emission unit 21 includes two types of resonance light beams 1 and 2 having different frequencies. When the above-described gaseous alkali metal is irradiated with the two types of resonance light beams 1 and 2, the light absorptivity (light transmittance) of the resonance light beams 1 and 2 in the alkali metal changes in accordance with a difference ($\omega 1 - \omega 2$) between a frequency $\omega 1$ of the resonance light beam 1 and a frequency $\omega 2$ of the resonance light beam 2.

When the difference ($\omega 1 - \omega 2$) between the frequency $\omega 1$ of the resonance light beam 1 and the frequency $\omega 2$ of the resonance light beam 2 is coincident with a frequency equivalent to an energy difference between the ground state 1 and the ground state 2, excitation to the excited state from each of the ground states 1 and 2 is stopped. At this time, both the resonance light beams 1 and 2 pass without being absorbed into the alkali metal. Such a phenomenon is referred to as a CPT phenomenon or an electromagnetically induced transparency (EIT) phenomenon.

For example, in a case where the light emission unit 21 fixes the frequency $\omega 1$ of the resonance light beam 1 and changes the frequency $\omega 2$ of the resonance light beam 2, when the difference ($\omega 1 - \omega 2$) between the frequency $\omega 1$ of the resonance light beam 1 and the frequency $\omega 2$ of the resonance light beam 2 is coincident with a frequency $\omega 0$ equivalent to an energy difference between the ground state 1 and the ground state 2, the detection intensity of the light detection unit 32 sharply increases as shown in FIG. 3. Such a sharp signal is detected as an EIT signal. The EIT signal has an eigenvalue which is determined in accordance with the type of an alkali metal. Therefore, it is possible to configure an oscillator by using such an EIT signal.

Hereinafter, a specific configuration of the atomic oscillator 1 of this embodiment will be described.

Figure 4:
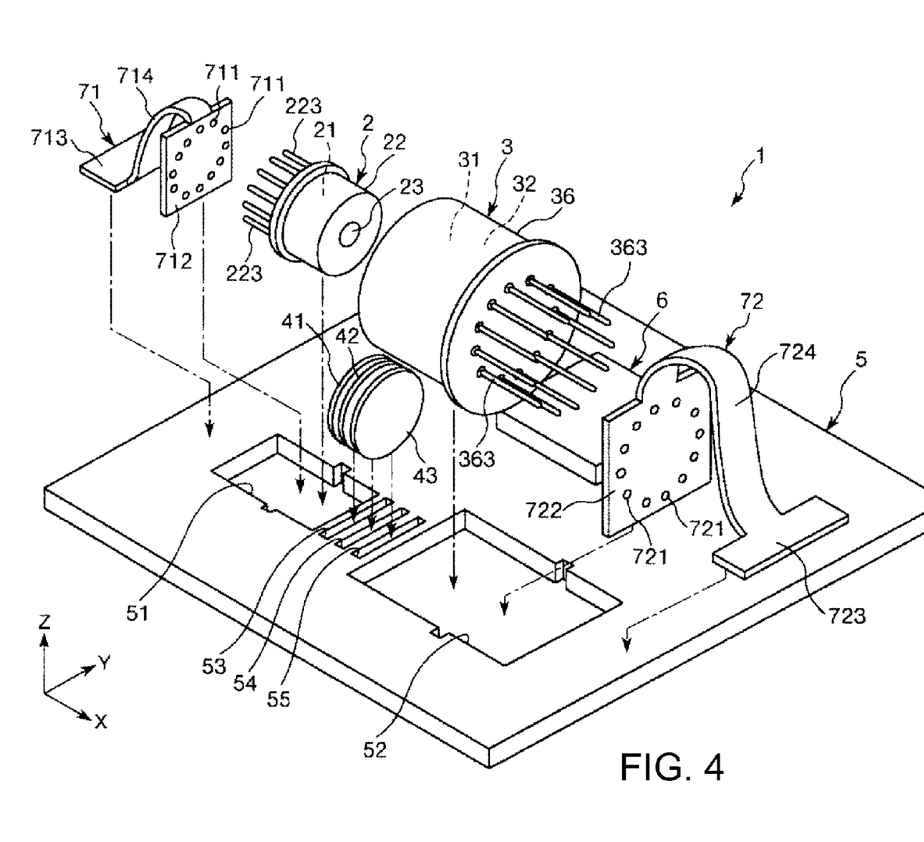
FIG. 4 is an exploded perspective view of the atomic oscillator shown in FIG. 1.
Figure 5:
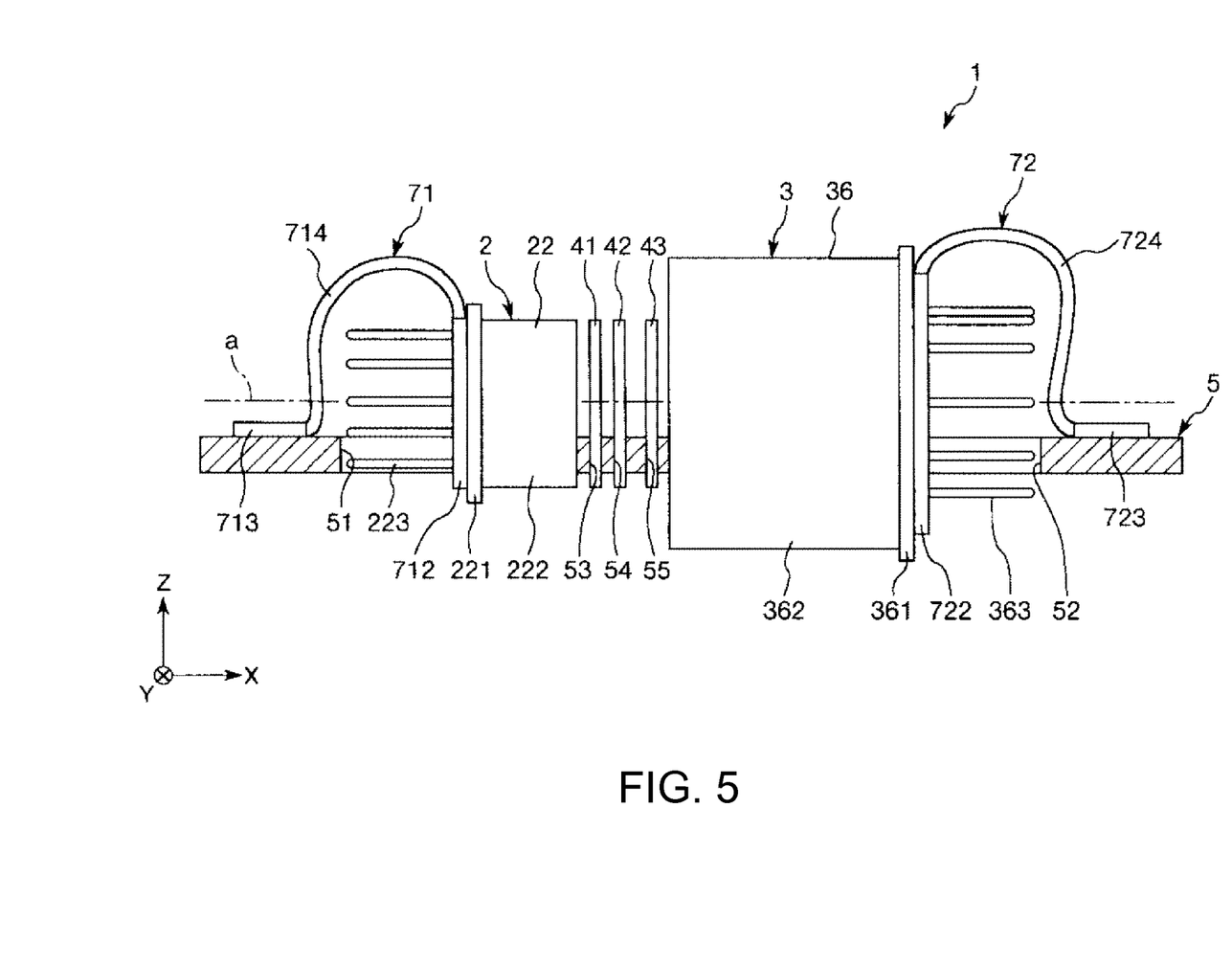
FIG. 5 is a longitudinal sectional view of the atomic oscillator shown in FIG. 1.
Figure 6:
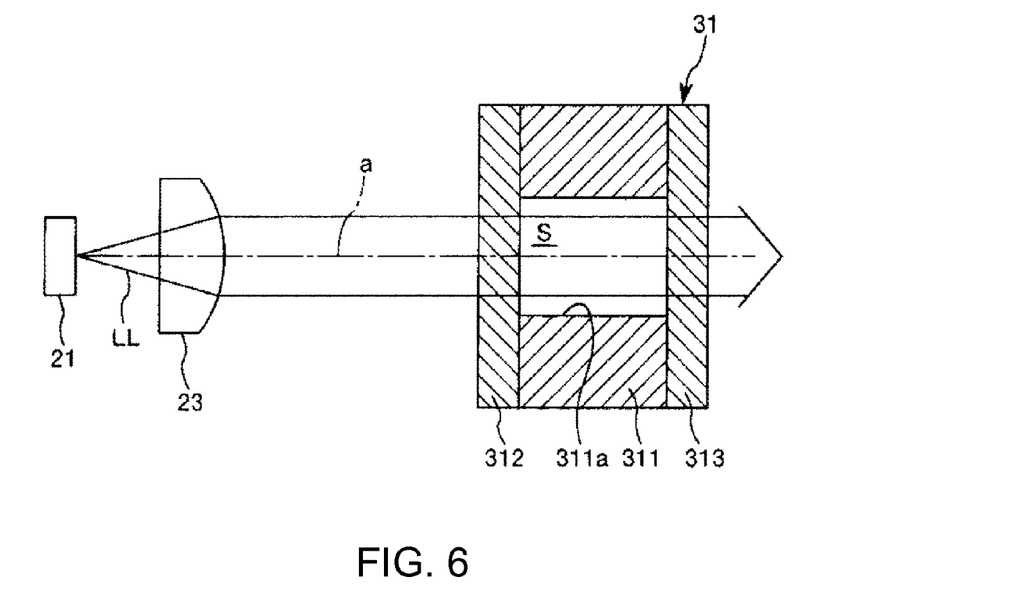
FIG. 6 is a diagram illustrating the light emission unit and a gas cell which are included in the atomic oscillator shown in FIG. 1.
Figure 7:
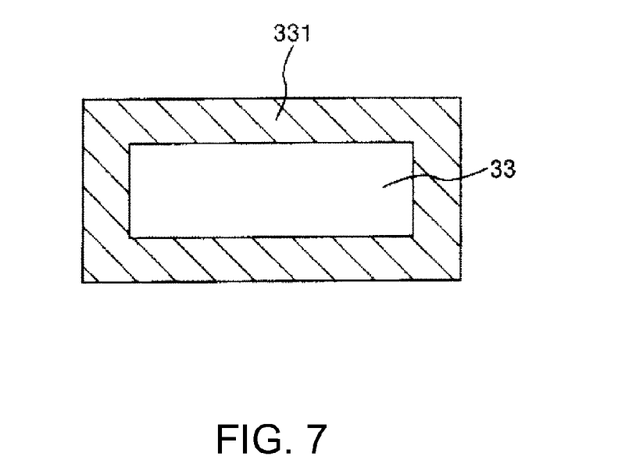
FIG. 7 is a schematic diagram (cross-sectional view) showing a casing (container) that accommodates a heater included in the atomic oscillator shown in FIG. 1.

FIG. 4 is an exploded perspective view of the atomic oscillator shown in FIG. 1, FIG. 5 is a longitudinal sectional view of the atomic oscillator shown in FIG. 1, FIG. 6 is a schematic diagram illustrating a light emission unit and a gas cell included in the atomic oscillator shown in FIG. 1, and FIG. 7 is a schematic diagram (cross-sectional view) showing a casing (container) that accommodates a heater included in the atomic oscillator shown in FIG. 1.

Meanwhile, in FIGS. 4 and 5, an X-axis, a Y-axis, and a Z-axis are shown as three mutually-perpendicular axes for convenience of description. A tip side of each arrow shown in the drawing is assumed to be a "+ side" and a base end side is assumed to be a "− side". Hereinafter, for convenience of description, a direction parallel to the X-axis is assumed to be an "X-axis direction", a direction parallel to the Y-axis is assumed to be a "Y-axis direction", and a direction parallel to the Z-axis is assumed to be a "Z-axis direction". In addition, a +z-direction side (upper side in FIG. 5) is assumed to be "up", and a −z-direction side (lower side in FIG. 5) is assumed to be "down".

As shown in FIG. 4, the control unit 6 is mounted on the atomic oscillator 1. The atomic oscillator includes a wiring board 5 (holding member) which holds the first unit 2, the second unit 3, and the optical components 41, 42, and 43, and connectors 71 and 72 that electrically connect the wiring board 5 and the first and second units 2 and 3.

The first unit 2 and the second unit 3 are electrically connected to the control unit 6 through a wiring (not shown) of the wiring board 5 and the connectors 71 and 72, and the driving thereof is controlled by the control unit 6.

Hereinafter, the units of the atomic oscillator 1 will be sequentially described in detail.

First Unit

As mentioned above, the first unit 2 includes the light emission unit 21 and the first package 22 accommodating the light emission unit 21.

Light Emission Unit

The light emission unit 21 has a function of emitting the excitation light LL for exciting the alkali metal atoms in the gas cell 31.

More specifically, the light emission unit 21 is used to emit light, which includes the above-described two types of light beams (the resonance light beam 1 and the resonance light beam 2) having different frequencies, as the excitation light LL.

The frequency $\omega 1$ of the resonance light beam 1 is capable of exciting (resonating) the alkali metal in the gas cell 31 to an excited state from the above-described ground state 1.

In addition, the frequency $\omega 2$ of the resonance light beam 2 is capable of exciting (resonating) the alkali metal in the gas cell 31 to an excited state from the above-described ground state 2.

The light emission unit 21 is not particularly limited as long as the unit is a unit capable of emitting the above-described excitation light LL, but a semiconductor laser such as, for example, a vertical cavity surface emitting laser (VCSEL) can be used as the unit.

In addition, the temperature of such a light emission unit 21 is adjusted to a predetermined temperature using a temperature adjusting element (a heating resistor, a Peltier element, or the like) not shown in the drawing.

First Package

The first package 22 accommodates the light emission unit 21 mentioned above.

As shown in FIG. 5, the first package 22 includes a base 221 (first base) and a lid 222 (first lid).

The base 221 directly or indirectly supports the light emission unit 21. In this embodiment, the base 221 has a plate shape, and has a circular shape when seen in a plan view.

The light emission unit 21 (mounting component) is installed (mounted) on one surface (mounting surface) of the base 221. In addition, a plurality of leads 223 protrude from the other surface of the base 221 as shown in FIG. 5. The plurality of leads 223 are electrically connected to the light emission unit 21 through wirings not shown in the drawing.

The lid 222 converting the light emission unit 21 on the base 221 is bonded to the base 221.

The lid 222 has a bottomed cylindrical shape in which one end thereof is opened. In this embodiment, a tubular portion of the lid 222 has a cylindrical shape.

The opening of one end of the lid 222 is closed by the base 221 mentioned above.

The other end of the lid 222, that is, the bottom of the lid 222 on the opposite side to the opening is provided with a window portion 23.

The window portion 23 is provided on an optical axis (axis a of the excitation light LL) between the gas cell 31 and the light emission unit 21.

The window portion 23 has light transmittance with respect to the excitation light LL mentioned above.

In this embodiment, the window portion 23 is a lens. Thus, it is possible to irradiate the gas cell 31 with the excitation light LL without any waste.

In addition, the window portion 23 has a function of converting the excitation light LL into parallel light. That is, the window portion 23 is a collimate lens, and the excitation light LL in an internal space S is parallel light. Thus, it is possible to increase the number of alkali metal atoms resonating by the excitation light LL emitted from the light emission unit 21 among alkali metal atoms which are present in the internal space S. As a result, it is possible to increase the intensity of an EIT signal.

Meanwhile, the window portion 23 is not limited to a lens as long as it is a portion having light transmittance with respect to the excitation light LL. For example, the window portion may be an optical component other than a lens, or may be a simple light transmissive plate-shaped member. In this case, a lens having the above-described function may be provided between the first package 22 and the second package 36 similar to, for example, the optical components 41, 42, and 43 to be described later.

A constituent material of a portion of the lid 222 other than the window portion 23 is not particularly limited. For example, ceramics, a metal, or a resin can be used as the constituent material.

Here, when the portion of the lid 222 other than the window portion 23 is formed of a material having light transmittance with respect to the excitation light, it is possible to integrally form the window portion 23 and the portion of the lid 222 other than the window portion 23. In addition, when the portion of the lid 222 other than the window portion 23 is formed of a material that does not have light transmittance with respect to the excitation light, the window portion 23 and the portion of the lid 222 other than the window portion 23 may be formed as separate bodies and may be bonded to each other using a well-known bonding method.

In addition, it is preferable that the base 221 and the lid 222 are airtightly bonded to each other. That is, it is preferable that the inside of the first package 22 is an airtight space. Thus, it is possible to set the inside of the first package 22 to be in a decompression state or a state where an inert gas is sealed. As a result, it is possible to improve the characteristics of the atomic oscillator 1.

In addition, a method of bonding the base 221 and the lid 222 is not particularly limited. For example, brazing, seam welding, or energy line welding (such as laser welding or electron beam welding) can be used as the method.

Meanwhile, a bonding material for bonding the base 221 and the lid 222 may be interposed therebetween.

In addition, components other than the light emission unit 21 mentioned above may be accommodated in the first package 22.

For example, a temperature adjusting element or a temperature sensor which adjusts the temperature of the light emission unit 21 may be accommodated in the first package 22. Examples of the temperature adjusting element include a heating resistor (heater), a Peltier element, and the like.

According to the first package 22 which is configured to include the base 221 and the lid 222, it is possible to accommodate the light emission unit 21 in the first package 22 while allowing the emission of excitation light to the outside of the first package 22 from the light emission unit 21.

In addition, the first package 22 is held in the wiring board 5 to be described later so that the base 221 is disposed on the opposite side to the second package 36.

Second Unit

As mentioned above, the second unit 3 includes the gas cell 31, the light detection unit 32, the heater 33, the temperature sensor 34, the coil 35, and the second package 36 that accommodates these components.

Gas Cell

An alkali metal such as gaseous rubidium, cesium, or sodium is sealed in the gas cell 31. In addition, a rare gas such as argon or neon and an inert gas such as nitrogen may be sealed as a buffer gas in the gas cell 31 together with an alkali metal gas, when necessary.

For example, as shown in FIG. 6, the gas cell 31 includes a main body 311 having a columnar through hole 311a, and a pair of window portions 312 and 313 that close both openings of the through hole 311a. Thus, the above-described internal space S having an alkali metal sealed therein is formed.

A material constituting the main body 311 is not particularly limited, but includes a metal material, a resin material, a glass material, a silicon material, quartz crystal, and the like. From the viewpoint of processability and bonding between the window portions 312 and 313, a glass material and a silicon material are preferably used.

The window portions 312 and 313 are airtightly bonded to such a main body 311. Thus, it is possible to make the internal space S of the gas cell 31 into an airtight space.

A method of bonding the main body 311 and the window portions 312 and 313 is determined in accordance with the constituent materials thereof, and is not particularly limited. For example, a bonding method using an adhesive, a direct bonding method, and an anodic bonding method can be used as the method.

In addition, a material constituting the window portions 312 and 313 is not particularly limited as long as the material has light transmittance with respect to the excitation light LL mentioned above. Examples of the material include a silicon material, a glass material, quartz crystal, and the like.

The window portions 312 and 313 have light transmittance with respect to the excitation light LL from the light emission unit 21 mentioned above. One window portion 312 transmits the excitation light LL which enters the gas cell 31, and the other window portion 313 transmits the excitation light LL emitted from the gas cell 31.

The gas cell 31 is heated by the heater 33, and the temperature thereof is adjusted to a predetermined temperature.

Light Detection Unit

The light detection unit 32 has a function of detecting the intensity of the excitation light LL (resonance light beams 1 and 2) passing through the gas cell 31.

The light detection unit 32 is not particularly limited as long as the unit is a unit capable of detecting the above-described excitation light. For example, a photodetector (light-receiving element) such as a solar cell or a photodiode can be used.

Heater

The heater 33 has a function of heating the above-described gas cell 31 (more specifically, an alkali metal in the gas cell 31). Thus, it is possible to maintain the alkali metal in the gas cell 31 to a gaseous state having a desired concentration.

The heater 33 is driven by receiving the supply of power, that is, is heated by electrical conduction. For example, the heater is constituted by a heating resistor provided on the outer surface of the gas cell 31. Such a heating resistor is formed using, for example, a chemical vapor deposition (CVD) such as a plasma CVD or a thermal CVD, a dry plating method such as vacuum deposition, or a sol-gel method.

Here, when the heating resistor is provided in an incidence unit or an emission unit of the excitation light LL of the gas cell 31, the heating resistor is constituted by a material having light transmittance with respect to the excitation light, specifically, a transparent electrode material such as an oxide, for example, indium tin oxide (ITO), indium zinc oxide (IZO), $In_3O_3$, $SnO_2$, $SnO_2$ containing Sb, or ZnO containing Al.

Meanwhile, the heater 33 is not particularly limited as long as the heater is a heater capable of heating the gas cell 31, and may not come into contact with the gas cell 31. In addition, the gas cell 31 may be heated using a Peltier element or a ceramic heater instead of the heater 33 or in conjunction with the heater 33.

Such a heater 33 is electrically connected to the temperature control unit 62 of the control unit 6 to be described later, and thus the electrical conduction thereof is controlled.

In addition, as shown in FIG. 7, the heater 33 has a magnetic shielding property and is accommodated in a casing (shielding portion) (container) 331 that shields a magnetic field generated in the heater 33 with respect to the outside. Thus, it is possible to prevent or suppress the magnetic field generated in the heater 33 from acting within the gas cell 31 by the electrical conduction to the heater 33.

A material having a magnetic shielding property is used as the constituent material of the casing 331. Examples of the material include soft magnetic materials such as Fe and various iron-based alloys (silicon iron, permalloy, amorphous, sendust, and Kovar). Among these, an Fe—Ni based alloy such as Kovar or permalloy is preferably used, and permalloy is more preferably used, from the viewpoint of an excellent magnetic shielding property. Meanwhile, it is needless to say that the casing 331 may be omitted.

Temperature Sensor

The temperature sensor 34 is used to detect the temperature of the heater 33 or the gas cell 31. The amount of heat generated by the heater 33 mentioned above is controlled on the basis of detection results of the temperature sensor 34. Thus, it is possible to maintain the alkali metal atoms within the gas cell 31 to a desired temperature.

Meanwhile, an installation position of the temperature sensor 34 is not particularly limited. For example, the temperature sensor may be installed on the heater 33 or may be installed on the outer surface of the gas cell 31.

The temperature sensor 34 is not particularly limited, and various types of temperature sensors such as a thermistor or a thermocouple can be used as the temperature sensor.

Such a temperature sensor 34 is electrically connected to the temperature control unit 62 of the control unit 6 to be described later through a wiring not shown in the drawing.

Coil

The coil 35 has a function of generating a magnetic field in a direction along (parallel to) the axis a of the excitation light LL in the internal space S by electrical conduction. Thus, it is possible to improve resolution by widening a gap between different energy levels at which the atoms of the alkali metal within the internal space S degenerate by Zeeman splitting, and to reduce a line width of an EIT signal. As a result, it is possible to increase the accuracy of the oscillation frequency of the atomic oscillator 1.

Meanwhile, the magnetic field generated by the coil 35 may be any of a DC magnetic field and an AC magnetic field, or may be a magnetic field in which a DC magnetic field and an AC magnetic field are superimposed on each other.

The installation position of the coil 35 is not particularly limited. Although not shown in the drawing, for example, the coil may be wound around the outer circumference of the gas cell 31 so as to configure a solenoid type, or a pair of coils may face each other through the gas cell 31 so as to configure a Helmholtz type.

The coil 35 is electrically connected to a magnetic field control unit 63 of the control unit 6 to be described later through a wiring not shown in the drawing. Thus, it is possible to electrify the coil 35.

Second Package

The second package 36 accommodates the gas cell 31, the light detection unit 32, the heater 33, the temperature sensor 34, and the coil 35 which are mentioned above.

The second package 36 has a magnetic shielding property and constitutes a "shielding portion (magnetic shielding case)" that shields the alkali metal within the gas cell 31 from an external magnetic field. Thus, it is possible to prevent or suppress an unnecessary magnetic field from acting within the gas cell 31. Meanwhile, a package, not shown in the drawing, which has a magnetic shielding property may be further included so as to accommodate the second package 36 and the like.

The second package 36 is configured in the same manner as the first package 22 of the first unit 2 mentioned above.

Specifically, as shown in FIG. 5, the second package 36 includes a base 361 (second base) and a lid 362 (second lid).

The base 361 directly or indirectly supports the gas cell 31, the light detection unit 32, the heater 33, the temperature sensor 34, and the coil 35. In this embodiment, the base 361 has a plate shape, and has a circular shape when seen in a plan view.

The gas cell 31, the light detection unit 32, the heater 33, the temperature sensor 34, and the coil 35 (a plurality of mounting components) are installed (mounted) on one surface (mounting surface) of the base 361. In addition, as shown in FIG. 5, a plurality of leads 363 protrude from the other surface of the base 361. The plurality of leads 363 are electrically connected to the light detection unit 32, the heater 33, the temperature sensor 34, and the coil 35 through wirings not shown in the drawing.

A material having a magnetic shielding property is used as the constituent material of the base 361. Examples of the material include soft magnetic materials such as Fe and various iron-based alloys (silicon iron, permalloy, amorphous, sendust, and Kovar). Among these, an Fe—Ni based alloy such as Kovar or permalloy is preferably used from the viewpoint of an excellent magnetic shielding property. For example, permalloy is more preferably used from the viewpoint of a more excellent magnetic shielding property without airtight bonding between the base 361 and the lid 362. In addition, Kovar is more preferably used from the viewpoint of simply and reliably performing airtight bonding between the base 361 and the lid 362 by welding. Meanwhile, the second package 36 may not have a magnetic shielding property. In this case, a material other than the above-described materials may be used as the constituent material of the base 361.

The lid 362 covering the gas cell 31, the light detection unit 32, the heater 33, the temperature sensor 34, and the coil 35, which are provided on the base 361, is bonded to the base 361.

The lid 362 has a bottomed cylindrical shape in which one end thereof is opened. In this embodiment, a tubular portion of the lid 362 has a cylindrical shape.

The opening of one end of the lid 362 is closed by the base 361 mentioned above.

The other end of the lid 362, that is, the bottom of the lid 362 on the opposite side to the opening is provided with a window portion 37.

The window portion 37 is provided on the optical axis (axis a) between the gas cell 31 and the light emission unit 21.

The window portion 37 has light transmittance with respect to the above-described excitation light.

In this embodiment, the window portion 37 is constituted by a plate-shaped member having light transmittance.

Meanwhile, the window portion 37 is not limited to the plate-shaped member having light transmittance as long as the window portion has light transmittance with respect to the excitation light. For example, the window portion may be an optical component such as a lens, a polarizing plate, or a λ/4 wavelength plate.

A constituent material of a portion of the lid 362 other than the window portion 37 is not particularly limited. For example, ceramics, a metal, or a resin can be used as the constituent material.

Here, when the portion of the lid 362 other than the window portion 37 is formed of a material having light transmittance with respect to the excitation light, it is possible to integrally form the window portion 37 and the portion of the lid 362 other than the window portion 37. In addition, when the portion of the lid 362 other than the window portion 37 is formed of a material that does not have light transmittance with respect to the excitation light, the window portion 37 and the portion of the lid 362 other than the window portion 37 may be formed as separate bodies and may be bonded to each other using a well-known bonding method.

In addition, it is preferable that the base 361 and the lid 362 are airtightly bonded to each other. That is, it is preferable that the inside of the second package 36 is an airtight space. Thus, it is possible to set the inside of the second package 36 to be in a decompression state or a state where an inert gas is sealed. As a result, it is possible to improve the characteristics of the atomic oscillator 1.

In addition, a method of bonding the base 361 and the lid 362 is not particularly limited. For example, brazing, seam welding, or energy line welding (such as laser welding or electron beam welding) can be used as the method.

Meanwhile, a bonding material for bonding the base 361 and the lid 362 may be interposed therebetween.

In addition, at least the gas cell 31 and the light detection unit 32 may be accommodated in the second package 36. Further, components other than the gas cell 31, the light detection unit 32, the heater 33, the temperature sensor 34, and the coil 35, which are mentioned above, may be accommodated in the second package.

According to the second package 36 which is configured to include the base 361 and the lid 362, it is possible to accommodate the gas cell 31 and the light detection unit 32 in the second package 36 while allowing the incidence of the excitation light from the light emission unit 21 on the second package 36. Therefore, the second package 36 is used in combination with the first package 22 mentioned above, and thus it is possible to accommodate the light emission unit 21 and the gas cell 31 in separate packages, which do not come into contact with each other, while securing an optical path of the excitation light to the light detection unit 32 through the gas cell 31 from the light emission unit 21.

In addition, the second package 36 is held by the wiring board 5 to be described later so that the base 361 is disposed on the opposite side to the first package 22.

Optical Component

The plurality of optical components 41, 42, and 43 are disposed between the first package 22 and the second package 36 which are mentioned above. The plurality of optical components 41, 42, and 43 are provided on the optical axis (axis a) between the light emission unit 21 within the first package 22 mentioned above and the gas cell 31 within the second package 36 mentioned above.

In this embodiment, the optical component 41, the optical component 42, and the optical component 43 are disposed in this order from the first package 22 side to the second package 36 side.

The optical component 41 is a λ/4 wavelength plate. Thus, for example, when the excitation light from the light emission unit 21 is linearly polarized light, the excitation light can be converted to circularly polarized light (right circularly polarized light or left circularly polarized light).

As described above, if alkali metal atoms within the gas cell 31 are irradiated with the excitation light which is linearly polarized light in a state where Zeeman splitting of the alkali metal atoms occurs due to a magnetic field of the coil 35 mentioned above, a plurality of levels of the alkali metal atoms having been subjected to Zeeman splitting are uniformly dispersed by interaction between the excitation light and the alkali metal atoms. As a result, the number of alkali metal atoms having a desired energy level becomes relatively smaller than the number of alkali metal atoms having other energy levels. Thus, the number of atoms expressing a desired EIT phenomenon is reduced, and a desired EIT signal becomes small. As a result, the oscillation characteristics of the atomic oscillator 1 are degraded.

On the other hand, as described above, when the alkali metal atoms within the gas cell 31 are irradiated with the excitation light which is circularly polarized light in a state where Zeeman splitting of the alkali metal atoms occurs due to a magnetic field of the coil 35 mentioned above, it is possible to make the number of alkali metal atoms having a desired energy level relatively larger than the number of alkali metal atoms having other energy levels among a plurality of levels of the alkali metal atoms having been subjected to Zeeman splitting, by interaction between the excitation light and the alkali metal atoms. For this reason, the number of atoms expressing a desired EIT phenomenon is increased, and a desired EIT signal becomes large. As a result, it is possible to improve the oscillation characteristics of the atomic oscillator 1.

In this embodiment, the optical component 41 has a disk shape. For this reason, it is possible to rotate the optical component 41 around an axis line parallel to the optical axis (axis a) in a state where the optical component engages with a through hole 53 having a shape to be described later. Meanwhile, the plan-view shape of the optical component 41 is not limited thereto, and may be a polygonal shape such as, for example, a quadrilateral shape or a pentagonal shape.

The optical components 42 and 43 are disposed on the second unit 3 side with respect to the optical component 41.

Each of the optical components 42 and 43 is a neutral density filter (ND filter). Thus, it is possible to adjust (decrease) the intensity of the excitation light LL incident on the gas cell 31. For this reason, even when an output of the light emission unit 21 is large, it is possible to set the amount of excitation light incident on the gas cell 31 to a desired amount. In this embodiment, the intensity of the excitation light, which is converted to the circularly polarized light by the optical component 41 mentioned above, is adjusted by the optical components 42 and 43.

In this embodiment, each of the optical components 42 and 43 has a plate shape. In addition, the plan-view shape of each of the optical components 42 and 43 is a circular shape. For this reason, it is possible to rotate the optical components 42 and 43 around the axis line parallel to the optical axis (axis a)

in a state where the optical components engage with the through hole 53 having a shape to be described later.

Meanwhile, the plan-view shape of each of the optical components 42 and 43 is not limited thereto, and may be a polygonal shape such as, for example, a quadrilateral shape or a pentagonal shape.

In addition, the optical component 42 and the optical component 43 may have the same dimming rate or may have different dimming rates.

In addition, each of the optical components 42 and 43 may have portions having continuously or gradually different dimming rates on the upper side and the lower side thereof. In this case, it is possible to adjust a dimming rate of excitation light by adjusting the positions of the optical components 42 and 43 in a vertical direction with respect to the wiring board 5.

In addition, each of the optical components 42 and 43 may have portions having continuously or gradually different dimming rates in a circumferential direction. In this case, it is possible to adjust a dimming rate of excitation light by rotating the optical components 42 and 43. Meanwhile, in this case, the rotation center of each of the optical components 42 and 43 may be shifted with respect to the axis a.

Meanwhile, any one of the optical components 42 and 43 may be omitted. In addition, when an output of the light emission unit 21 is moderate, both the optical components 42 and 43 can be omitted.

In addition, the optical components 41, 42, and 43 are not limited to the above-described types, arrangement order, number, and the like. For example, each of the optical components 41, 42, and 43 is not limited to the λ/4 wavelength plate or the neutral density filter, and may be a lens, a polarizing plate, or the like.

Wiring Board

The wiring board 5 has a wiring not shown in the drawing, and has a function of electrically connecting the electronic component such as the control unit 6 which is mounted on the wiring board 5 and the connectors 71 and 72 through the wiring.

In addition, the wiring board 5 has a function of holding the first package 22, the second package 36, and the plurality of optical components 41, 42, and 43 which are mentioned above.

The wiring board 5 holds the first package 22 and the second package 36 in a state where the packages do not come into contact with a space interposed therebetween. Thus, it is possible to prevent or suppress thermal interference between the light emission unit 21 and the gas cell 31 and to independently control the temperatures of the light emission unit 21 and the gas cell 31 with a high level of accuracy.

Specifically, as shown in FIG. 4, through holes 51, 52, 53, 54, and 55 are formed in the wiring board 5 so as to pass through the wiring board in the thickness direction thereof.

Here, the through hole 51 (first through hole) is provided on one end side of the wiring board 5 in the X-axis direction, and the through hole 52 (second through hole) is provided on the other end side of the wiring board 5 in the X-axis direction. The through holes 53, 54, and 55 (third through hole) are provided between the through hole 51 and the through hole 52 of the wiring board 5.

In this embodiment, the through holes 51, 52, 53, 54, and 55 are independently formed. For this reason, it is possible to achieve excellent rigidity of the wiring board 5.

A portion of the first package 22 is inserted into the through hole 51 from above. Thus, the first package 22 is positioned in the X-axis direction, the Y-axis direction, and the Z-axis direction with respect to the wiring board 5.

In this embodiment, a width of the through hole 51 in the Y-axis direction is smaller than a width of the first package 22 (diameter of a cylindrical portion) in the Y-axis direction. For this reason, the first package 22 engages with (abuts on) an edge portion of the through hole 51 in a state where the central axis of the cylindrical portion is located above the wiring board 5.

In addition, it is possible to reduce a contact area between the first package 22 and the wiring board 5 by causing the first package 22 to abut on the edge portion of the through hole 51. Thus, it is possible to suppress heat transfer between the first package 22 and the wiring board 5.

Similarly, a portion of the second package 36 is inserted into the through hole 52. Thus, the second package 36 is positioned in the X-axis direction, the Y-axis direction, and the Z-axis direction with respect to the wiring board 5. In addition, similarly to the first package 22, it is possible to reduce a contact area between the second package 36 and the wiring board 5 by causing the second package 36 to abut on an edge portion of the through hole 52. Thus, it is possible to suppress heat transfer between the second package 36 and the wiring board 5.

In this manner, the heat transfer between the first package 22 and the second package 36 through the wiring board 5 can be suppressed, and thus it is possible to suppress thermal interference between the light emission unit 21 and the gas cell 31.

According to the wiring board 5 having the through holes 51 and 52, the first package 22 and the second package 36 are installed on the wiring board 5. Thus, it is possible to perform positioning of an optical system including the light emission unit 21 and the light detection unit 32. For this reason, it is possible to facilitate the installation of the first package 22 and the second package 36 with respect to the wiring board 5.

In addition, it is possible to reduce the number of components as compared with a case where a member holding the first package 22 and the second package 36 is separately provided from the wiring board 5. As a result, it is possible to achieve cost reduction and miniaturization of the atomic oscillator 1.

In this embodiment, as described above, the through hole 51 into which the first package 22 is inserted and the through hole 52 into which the second package 36 is inserted are individually formed in the wiring board 5, and thus it is possible to maintain the first package 22 and the second package 36 by the wiring board 5 while having excellent rigidity of the wiring board 5.

In addition, a portion of the optical component 41 is inserted into the through hole 53. Thus, the optical component 41 is positioned in the X-axis direction, the Y-axis direction, and the Z-axis direction with respect to the wiring board 5.

Similarly, a portion of the optical component 42 is inserted into the through hole 54. Thus, the optical component 42 is positioned in the X-axis direction, the Y-axis direction, and the Z-axis direction with respect to the wiring board 5.

In addition, a portion of the optical component 43 is inserted into the through hole 55. Thus, the optical component 43 is positioned in the X-axis direction, the Y-axis direction, and the Z-axis direction with respect to the wiring board 5.

According to the wiring board 5 having the through holes 53, 54, and 55, the wiring board holds the optical components 41, 42, and 43. Thus, when the components of the wiring board 5 are mounted at the time of manufacturing the atomic oscillator 1, it is possible to install the optical components 41, 42, and 43 in the wiring board while adjusting the positions or postures thereof in a state where the first package 22 and the second package 36 are held by the wiring board 5.

The through hole 53 can rotatably hold the optical component 41 around the axis line (for example, axis a) along a line segment connecting the first package 22 and the second package 36. Thus, it is possible to adjust the posture of the optical component 41 around the axis a in a state where the optical component 41 engages with the through hole 53 of the wiring board 5 and is positioned in a direction parallel to the axis a.

Similarly, the through hole 54 can rotatably hold the optical component 42 around the axis line along the line segment connecting the first package 22 and the second package 36. In addition, the through hole 55 can rotatably hold the optical component 43 around the axis line along the line segment connecting the first package 22 and the second package 36.

In this embodiment, the through holes 53, 54, and 55 are formed so that plate faces of the optical components 41, 42, and 43 are parallel to each other. In addition, the through holes 53, 54, and 55 are formed so that the plate faces of the optical components 41, 42, and 43 are perpendicular to the axis a. Meanwhile, the through holes 53, 54, and 55 may be formed so that the plate faces of the optical components 41, 42, and 43 are not parallel to each other, or may be formed so that the plate faces of the optical components 41, 42, and 43 are inclined to the axis a.

Here, as described above, the optical component 41 is a $\lambda/4$ wavelength plate. Thus, it is possible to convert the excitation light from the light emission unit 21 from linearly polarized light to circularly polarized light by adjusting the posture of the optical component 41 by rotation regardless of the posture of the first package 22 with respect to the wiring board 5.

When the optical components 41, 42, and 43 are installed in the wiring board 5, for example, first, the first unit 2 and the second unit 3 are installed and fixed to the wiring board 5. Thereafter, at least one of the positions and postures of the optical components 41, 42, and 43 is changed while confirming an EIT signal and the like in a state where the optical components 41, 42, and 43 engage with the corresponding through holes 53, 54, and 55. In a state where a desired EIT signal is confirmed, the optical components 41, 42, and 43 are fixed to the wiring board 5. Although such fixation is not particularly limited, for example, a photocurable adhesive is suitably used. Even when the photocurable adhesive is supplied to the through holes 53, 54, and 55 before the photocurable adhesive is hardened, the positions or postures of the optical components 41, 42, and 43 can be changed, and then the photocurable adhesive can be hardened in a short period of time when desired to thereby perform fixation.

Various types of printed wiring boards can be used as the wiring board 5. However, as described above, from the viewpoint of securing rigidity required to maintain a positional relationship between the first package 22, the second package 36, and the optical components 41, 42, and 43 which are held in the above-described manner, a substrate having a rigid portion, for example, a rigid substrate and a rigid flexible substrate are preferably used.

Meanwhile, even when a wiring board (for example, flexible substrate) which does not have a rigid portion is used as the wiring board 5, for example, a reinforcing member for improving rigidity is bonded to such a wiring board. Thus, it is possible to maintain a positional relationship between the first package 22, the second package 36, and the optical components 41, 42, and 43.

The control unit 6 and the connectors 71 and 72 are installed on one surface of the wiring board 5. Meanwhile, electronic components other than the control unit 6 may be mounted on the wiring board 5.

Control Unit

The control unit 6 shown in FIG. 1 has a function of controlling the heater 33, the coil 35, and the light emission unit 21.

In this embodiment, the control unit 6 is constituted by an integrated circuit (IC) mounted on the wiring board 5.

The control unit 6 includes an excitation light control unit (light emission unit control unit) 61 that controls frequencies of the resonance light beams 1 and 2 of the light emission unit 21, a temperature control unit 62 that controls the temperature of an alkali metal in the gas cell 31, and a magnetic field control unit 63 that controls a magnetic field to be applied to the gas cell 31.

The temperature control unit 62 controls the driving of the heater (heating unit) 33, that is, controls electrical conduction to the heater 33 on the basis of detection results of the temperature sensor 34. Thus, the gas cell 31 can be maintained in a desired temperature range.

In addition, the magnetic field control unit 63 controls electrical conduction to the coil 35 so that a magnetic field generated by the coil 35 becomes constant.

In addition, the excitation light control unit 61 controls the driving of the light emission unit 21, that is, controls frequencies of the resonance light beams 1 and 2 emitted from the light emission unit 21 on the basis of detection results of the light detection unit 32 mentioned above. More specifically, the excitation light control unit 61 controls the frequencies of the resonance light beams 1 and 2 emitted from the light emission unit 21 so that a frequency difference ($\omega 1 - \omega 2$) is set to a frequency $\omega 0$ inherent in the alkali metal, on the basis of the detection results of the light detection unit 32 mentioned above.

In addition, the excitation light control unit 61 includes a quartz crystal oscillator (oscillation circuit) 13 and a multiplier 611 which is electrically connected to an output terminal of the quartz crystal oscillator. An oscillation frequency (resonance frequency) of the quartz crystal oscillator 13 is output as an output signal of the atomic oscillator 1 while synchronizing and adjusting the oscillation frequency on the basis of the detection results of the light detection unit 32. For example, a voltage-controlled quartz crystal oscillator can be used as the quartz crystal oscillator 13.

Here, as a specific example of the adjustment of the oscillation frequency of the quartz crystal oscillator 13, a description will be made of an example of a case where the frequency $\omega 0$ inherent in an alkali metal is 9.2 GHz, the oscillation frequency of the quartz crystal oscillator 13 is maintained to 10 kHz, and the signal of 10 kHz is output as an output signal of the atomic oscillator 1.

First, a signal (frequency: 10 kHz) which is output from the quartz crystal oscillator 13 is multiplied by $4.6 \times 10^5$ times (frequency: 4.6 GHz) by the multiplier 611, is combined with a predetermined DC current, is subjected to frequency modulation, and is then transmitted to the light emission unit 21. The light emission unit 21 is driven using the signal and emits the above-described excitation light LL. The excitation light LL passing through the gas cell 31 is received in the light detection unit 32. The intensity of the excitation light LL is detected by the light detection unit 32, and the detection results of the light detection unit 32 are input to the excitation light control unit 61. The excitation light control unit 61 compares the intensity of an EIT signal and a threshold value which is set in advance. When the intensity of the EIT signal is equal to or greater than the threshold value, it is determined that the quartz crystal oscillator 13 oscillates at a frequency of 10 kHz, and the oscillation frequency of the quartz crystal oscillator 13 is locked (fixed).

However, the oscillation frequency of the quartz crystal oscillator 13 changes over time for a long period of time due to reasons such as aging deterioration of the quartz crystal of the quartz crystal oscillator 13. Consequently, the oscillation frequency of the quartz crystal oscillator 13 is adjusted.

When the oscillation frequency of the quartz crystal oscillator 13 is adjusted, the intensity of the EIT signal is compared with a threshold value in the above-described manner while changing the oscillation frequency of the quartz crystal oscillator 13 to approximately 10 kHz. When the intensity of the EIT signal is equal to or greater than the threshold value, the oscillation frequency of the quartz crystal oscillator 13 is locked. Thus, a state where the quartz crystal oscillator 13 oscillates at 10 kHz is held.

Connector

The connector 71 (first connector) is mounted to the first package 22, and has a function of electrically connecting the light emission unit 21 and the wiring board 5. Thus, the light emission unit 21 within the first package 22 is electrically connected to the control unit 6 through the connector 71.

In addition, the connector 72 (second connector) is mounted to the second package 36, and has a function of electrically connecting the light detection unit 32, the heater 33, the temperature sensor 34, the coil 35 and the like to the wiring board 5. Thus, the light detection unit 32, the heater 33, the temperature sensor 34, and the coil 35 within the second package 36 are electrically connected to the control unit 6 through the connector 72.

As shown in FIG. 4, the connector 71 includes a connector portion 712 mounted to the first package 22, a fixation portion 713 fixed to the wiring board 5, and a cable portion 714 that connects the connector portion 712 and the fixation portion 713.

The connector portion 712 has a sheet shape and has a plurality of through holes 711 passing through the connector portion in the thickness direction thereof.

The plurality of through holes 711 are provided so as to correspond to the plurality of leads 223 of the first package 22. The plurality of leads 223 are inserted into the respective plurality of through holes 711.

The plurality of leads 223 are fixed to the connector portion 712 as shown in FIG. 5 using, for example, solder, and are electrically connected to a wiring (not shown) provided in the connector portion 712.

On the other hand, the fixation portion 713 has a sheet shape and is fixed to the wiring board 5 as shown in FIG. 5 using, for example, an anisotropic conductive adhesive (ACF). A wiring (not shown) provided in the fixation portion 713 is electrically connected to a wiring (not shown) of the wiring board 5 mentioned above.

In addition, the wiring (not shown) of the fixation portion 713 is electrically connected to a wiring (not shown) of the connector portion 712 through a wiring (not shown) provided in the cable portion 714.

Similarly to the connector 71 mentioned above, as shown in FIG. 4, the connector 72 includes a connector portion 722 mounted to the second package 36, a fixation portion 723 fixed to the wiring board 5, and a cable portion 724 connecting the connector portion 722 and the fixation portion 723.

The connector portion 722 has a sheet shape and has a plurality of through holes 721 passing through the connector portion in the thickness direction thereof.

The plurality of through holes 721 are provided so as to correspond to the plurality of leads 363 of the second package 36. The plurality of leads 363 are inserted into the respective plurality of through holes 721.

The plurality of leads 363 are fixed to the connector portion 722 as shown in FIG. 5 using, for example, solder, and are electrically connected to a wiring (not shown) provided in the connector portion 722.

On the other hand, the fixation portion 723 has a sheet shape and is fixed to the wiring board 5 as shown in FIG. 5 using, for example, an anisotropic conductive adhesive (ACF). A wiring (not shown) provided in the fixation portion 723 is electrically connected to a wiring (not shown) of the wiring board 5 mentioned above.

In addition, the wiring (not shown) of the fixation portion 723 is electrically connected to a wiring (not shown) of the connector portion 722 through a wiring (not shown) provided in the cable portion 724.

Each of the connectors 71 and 72 is constituted by a flexible substrate. That is, in the connector 71, each of the connector portion 712, the fixation portion 713, and the cable portion 714 is constituted by a flexible substrate, and the connector portion 712, the fixation portion 713, and the cable portion 714 are integrally formed. Similarly, in the connector 72, each of the connector portion 722, the fixation portion 723, and the cable portion 724 is constituted by a flexible substrate, and the connector portion 722, the fixation portion 723, and the cable portion 724 are integrally formed.

In this manner, it is possible to achieve miniaturization and cost reduction of the atomic oscillator 1 by using the connectors 71 and 72, each of which is constituted by a flexible substrate.

Meanwhile, electrical connection between the light emission unit 21 and the wiring board 5 and electrical connection between the wiring board 5 and the light detection unit 32 and the like are not limited to the connectors 71 and 72 mentioned above, respectively. For example, the connector portion may be a portion having a socket shape.

As shown in FIG. 1, the atomic oscillator 1 mentioned above is provided in the wiring board 5 and has a power terminal 15 which is electrically connected to the power supply 16, and thus a power supply voltage is applied to the power terminal 15 from the power supply 16. Meanwhile, the power supply 16 may be embedded in or detachable from the atomic oscillator 1, and may be a power supply outside the atomic oscillator 1.

An output terminal of the power terminal 15 is electrically connected to the excitation light control unit 61 and the temperature control unit 62. A power supply voltage is applied to the excitation light control unit 61 and the temperature control unit 62 through the power terminal 15.

In addition, the atomic oscillator 1 is provided in the wiring board 5 and includes a boosting circuit 14 that boosts a voltage applied to the heater 33. The boosting circuit 14 is provided between the power terminal 15 and the heater 33. An input terminal of the boosting circuit 14 is electrically connected to the power terminal 15, and an output terminal of the boosting circuit 14 is electrically connected to the heater 33. Thus, a power supply voltage is boosted by the boosting circuit 14 and is then applied to the heater 33. Accordingly, it is possible to reduce a current flowing through the heater 33 while maintaining constant power supplied to the heater 33. Thus, it is possible to reduce a magnetic field generated by the current flowing through the heater 33 at the time of electrical conduction to the heater 33 and to prevent or suppress the magnetic field from exerting an adverse effect within the gas cell 31.

The boosting circuit 14 is not particularly limited as long as the circuit is a circuit capable of boosting a voltage, but a circuit having a switching regulator function such as a switching regulator is preferably used as the boosting circuit. The switching regulator function is a function of converting a DC voltage into a DC voltage having a different value and outputting the DC voltage, and it is possible to achieve high efficiency and cost reduction by using a boosting circuit having a switching regulator function.

In addition, when a boosting circuit having a switching regulator function is used as the boosting circuit 14, a switching frequency is not particularly limited and is appropriately set in accordance with the terms and conditions. The switching frequency is preferably equal to or higher than 10 kHz and equal to or lower than 10 MHz, and is more preferably equal to or higher than 100 kHz and equal to or lower than 3 MHz. Here, a magnetic field generated by electrical conduction to the heater 33 has a component relying on the switching frequency of the boosting circuit 14. On the other hand, the light emission unit 21 is driven using a signal having been subjected to frequency modulation by a low frequency (for example, approximately 100 Hz) and emits the excitation light LL. Thus, there is a tendency for atomic resonance to be influenced by a magnetic field having a frequency component near the frequency of the frequency modulation. For this reason, it is preferable that the switching frequency is separated from the frequency of the frequency modulation. Therefore, when the switching frequency is lower than the lower limit, the magnetic field generated by the electrical conduction to the heater 33 exerts an adverse effect on the atomic resonance depending on other conditions. In addition, when the switching frequency is higher than the upper limit, for example, noise is generated in an output signal due to access to an output frequency, depending on other conditions.

In addition, an amplification factor of a voltage of the boosting circuit 14 is not particularly limited and is appropriately set in accordance with the terms and conditions. The amplification factor is preferably two times or more and five times or less, and is more preferably three times or more and 4.5 times or less. Meanwhile, the amplification factor of the voltage is a value obtained by dividing a voltage after amplification by a voltage before amplification. When the amplification factor of the voltage is smaller than the lower limit, a magnetic field generated by electrical conduction to the heater 33 may be excessively increased depending on other conditions. In addition, when the amplification factor of the voltage is larger than the upper limit, a member having a high breakdown voltage is required depending on other conditions. Thus, the size and cost of a device may be increased, and noise may become large.

In addition, a current to be supplied to the heater 33 is not particularly limited and is appropriately set in accordance with the terms and conditions. The current is preferably equal to or lower than 1.5 A, is more preferably equal to or lower than 300 mA, and is further preferably equal to or higher than 1 mA and equal to or lower than 300 mA. In addition, a voltage to be applied to the heater 33 is not particularly limited and is appropriately set in accordance with the terms and conditions. The voltage is preferably equal to or higher than 6 V and equal to or lower than 15 V, and is more preferably equal to or higher than 8 V and equal to or lower than 14 V.

In addition, the output terminal of the boosting circuit 14 is not electrically connected to other units such as the light emission unit 21, the light detection unit 32, the excitation light control unit 61, and the temperature control unit 62. That is, the boosting circuit 14 is a circuit exclusively for the heater 33. Thus, parameters of the boosting circuit 14 can be freely set so as to be optimized for the heater 33.

As described above, according to the atomic oscillator 1, first, it is possible to reduce power consumption by decreasing a power supply voltage. It is possible to reduce a current flowing through the heater 33 while maintaining constant power supplied to the heater 33 by boosting a voltage applied to the heater 33 using the boosting circuit 14. Thus, it is possible to reduce a magnetic field generated in the heater 33 by electrical conduction to the heater 33. Accordingly, it is possible to prevent or suppress the magnetic field generated in the heater 33 from exerting an adverse effect within the gas cell 31, to stabilize a magnetic field generated in the internal space S of the gas cell 31, and to improve the accuracy of an oscillation frequency of the atomic oscillator 1. In addition, it is possible to simplify a magnetic shield.

2. Electronic Apparatus

The above-described atomic oscillator can be incorporated in various types of electronic apparatuses. Such electronic apparatuses have excellent reliability.

Hereinafter, an electronic apparatus according to the invention will be described.

Figure 8:
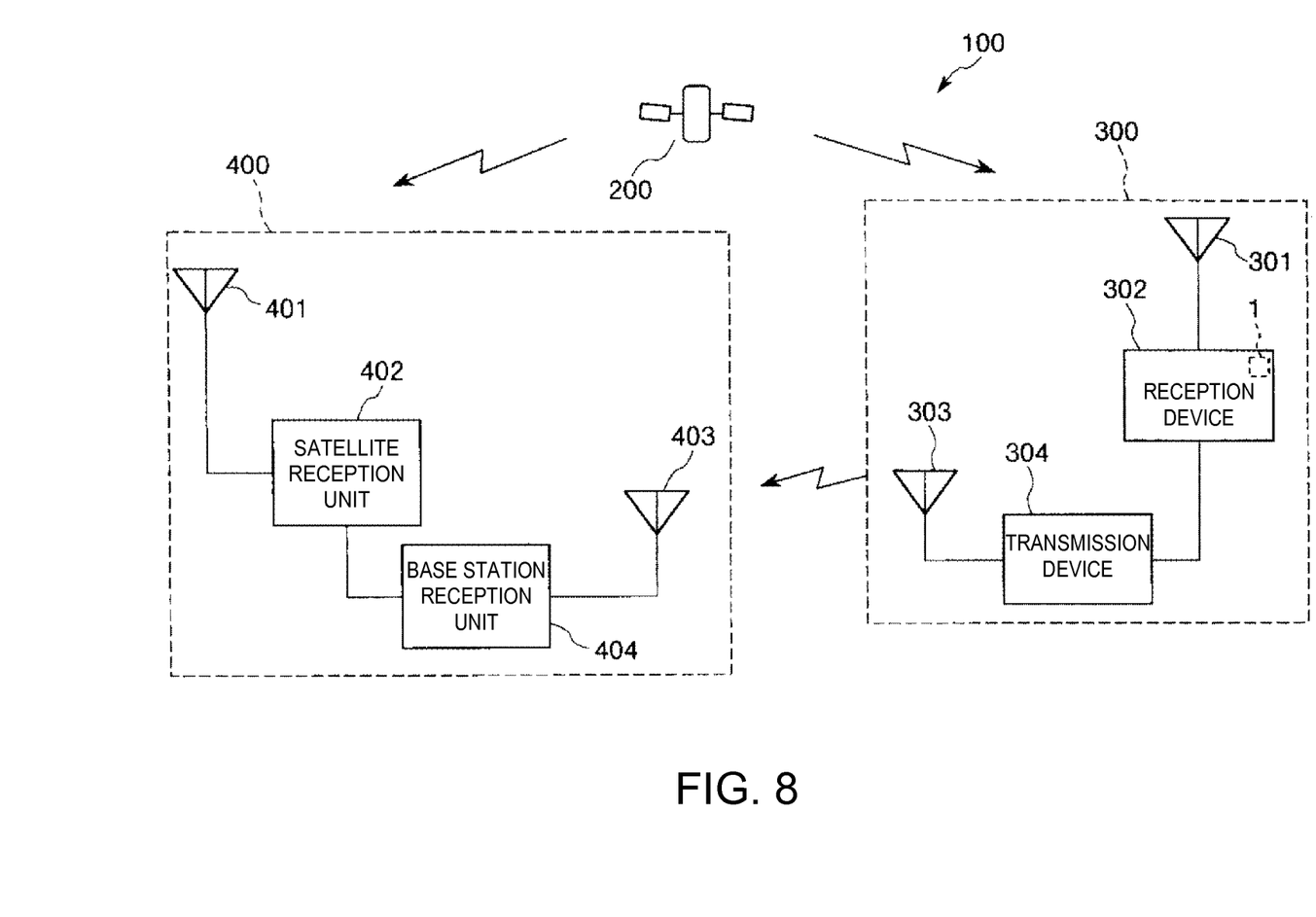
FIG. 8 is a schematic diagram showing a system configuration in a case where the atomic oscillator according to the invention is used in a positioning system using a GPS satellite.

FIG. 8 is a schematic diagram showing a system configuration in a case where the atomic oscillator according to the invention is used in a positioning system using a GPS satellite.

A positioning system 100 shown in FIG. 8 includes a GPS satellite 200, a base station device 300, and a GPS reception device 400.

The GPS satellite 200 transmits positioning information (GPS signal).

The base station device 300 includes a reception device 302 that receives positioning information from the GPS satellite 200 with a high level of accuracy through an antenna 301 installed, for example, at an electronic reference point (GPS continuous observation station), and a transmission device 304 that transmits the positioning information, which is received by the reception device 302, through an antenna 303.

Here, the reception device 302 is an electronic device including the atomic oscillator 1 mentioned above according to the invention as the reference frequency oscillation source thereof. The reception device 302 has excellent reliability. In addition, the positioning information received by the reception device 302 is transmitted by the transmission device 304 in real time.

The GPS reception device 400 includes a satellite reception unit 402 that receives positioning information from the GPS satellite 200 through an antenna 401, and a base station reception unit 404 that receives positioning information from the base station device 300 through an antenna 403.

3. Moving Object

Figure 9:
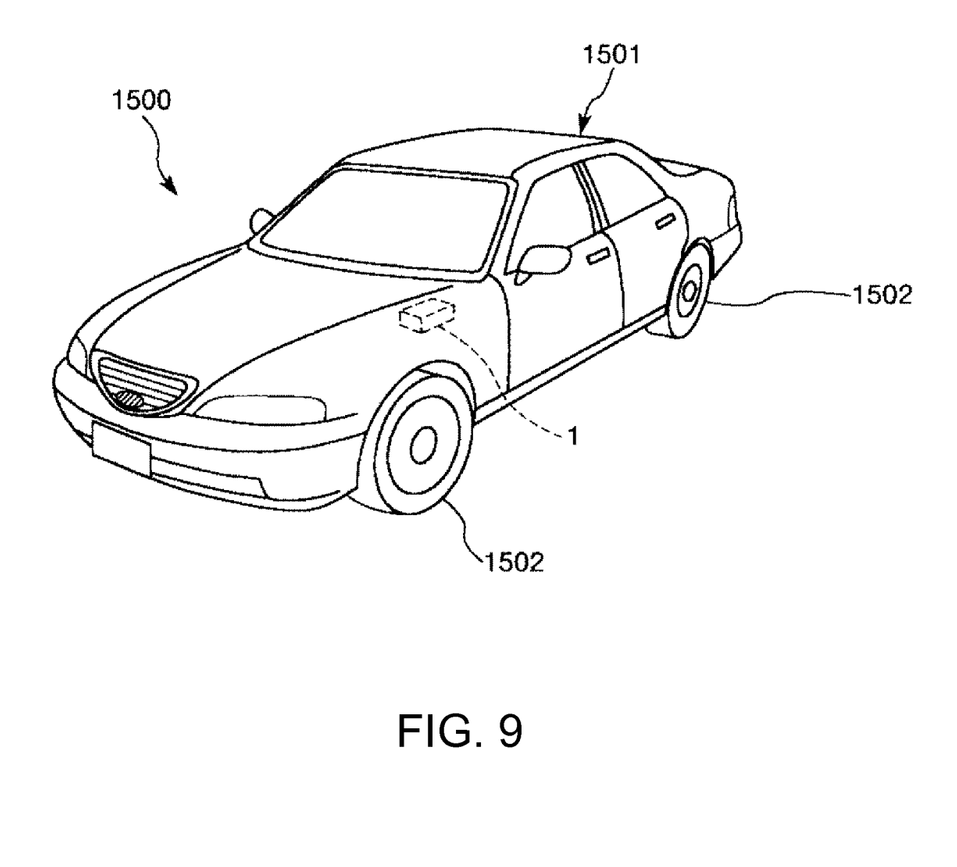
FIG. 9 is a diagram showing an example of a moving object according to the invention.

FIG. 9 is a diagram showing an example of a moving object according to the invention.

In this diagram, a moving object 1500 includes a car body 1501 and four wheels 1502, and is configured to rotate the wheels 1502 using a power source (engine), not shown in the drawing, which is provided in the car body 1501. The atomic oscillator 1 is incorporated in the moving object 1500.

According to such a moving object, it is possible to exhibit excellent reliability.

Meanwhile, an electronic apparatus including the atomic oscillator (quantum interference device according to the invention) according to the invention is not limited to the above-described apparatus, and can be applied to, for example, a mobile phone, a digital still camera, an ink jet type discharge apparatus (for example, an ink jet printer), a personal computer (a mobile personal computer and a laptop type personal computer), a television, a video camera, a video tape recorder, a car navigation apparatus, a pager, an electronic organizer (an electronic organizer with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish finder, various measurement apparatuses, instruments (for example, instruments for vehicles, aircraft, and ships), a flight simulator, terrestrial digital broadcasting, a mobile phone base station, and the like.

The quantum interference device, the atomic oscillator, the electronic apparatus, and the moving object according to the invention have been described so far with reference to the an embodiment shown in the accompanying drawings, but the invention is not limited thereto.

In the quantum interference device, the atomic oscillator, the electronic apparatus, and the moving object according to the invention, a configuration of each unit can be replaced with any configuration exhibiting the same function, and can be added with any configuration.

In the invention, any configurations of the above-described embodiment may be combined with each other.

In the invention, the structure of the atomic oscillator (quantum interference device) is not limited to the configuration of the above-described embodiment as long as a boosting circuit boosting a voltage applied to a heating unit is provided.

For example, in the above-described embodiment, a description has been made of an example of a structure in which the gas cell is disposed between the light emission unit and the light detection unit. However, the light emission unit and the light detection unit may be disposed on the same side as the gas cell, and the light detection unit may detect light reflected from a surface on the opposite side to the light emission unit and the light detection unit of the gas cell or from a mirror provided on the opposite side to the light emission unit and the light detection unit of the gas cell.

In the above-described embodiment, a description has been made of an example of a case where the first package, the second package, and the optical components engage with the through holes formed in the wiring board, but is not limited thereto. For example, the first package, the second package, and the optical components may be disposed on one surface of the wiring board, and a box-shaped or block-shaped holder may collectively hold the first package, the second package, and the optical components and may be disposed on the wiring board. In addition, a plurality of components including the light emission unit, the gas cell, the light detection unit, and the like may be accommodated in one package.

In the above-described embodiment, a description has been made of an example of an atomic oscillator which is a type using a quantum interference effect based on two types of light beams having different wavelengths, but is not limited thereto. For example, an atomic oscillator which is a type using a double resonance phenomenon based on light and microwaves may be used.

The entire disclosure of Japanese Patent Application No. 2013-258548, filed Dec. 13, 2013 is expressly incorporated by reference herein.

What is claimed is:

1. A quantum interference device comprising:
   a gas cell in which metal atoms are sealed;
   a heating unit that heats the gas cell by receiving supply of power;
   a power terminal; and
   a boosting circuit that boosts a voltage output from the power terminal and applies the voltage to the heating unit, wherein
   the boosting circuit has a switching regulator, and
   a switching frequency of the switching regulator is an a range of equal to or higher than 10 kHz and equal to or lower than 10 MHz.

2. The quantum interference device according to claim 1, wherein an amplification factor of a voltage of the boosting circuit is in a range of two times or more and five times or less.

3. The quantum interference device according to claim 1, further comprising:
   a light emission unit that emits light toward the gas cell;
   a light detection unit that detects intensity of the light having passed through the gas cell;
   a light emission unit control unit that controls driving of the light emission unit; and
   a temperature control unit that controls driving of the heating unit,
   wherein the boosting circuit is not connected to the light emission unit, the light detection unit, the light emission unit control unit, and the temperature control unit.

4. The quantum interference device according to claim 1, wherein the heating unit includes a heater having a heating resistor and the quantum interference device further comprises a temperature control unit that controls driving of the heater.

5. The quantum interference device according to claim 4, further comprising a container that accommodates the heater and has a magnetic shielding property.

6. The quantum interference device according to claim 1, further comprising a shielding portion having a magnetic shielding property.

7. An atomic oscillator comprising the quantum interference device according to claim 1.

8. An electronic apparatus comprising the quantum interference device according to claim 1.

9. A moving object comprising the quantum interference device according to claim 1.

* * * * *